United States Patent [19]

Shea

[11] Patent Number: 4,584,039

[45] Date of Patent: Apr. 22, 1986

[54] FINE LINE FLEXIBLE CABLE FABRICATION PROCESS

[75] Inventor: Paul Y. Shea, Irvine, Calif.

[73] Assignee: Hughes Aircraft Co., Los Angeles, Calif.

[21] Appl. No.: 686,364

[22] Filed: Dec. 26, 1984

[51] Int. Cl.$^4$ .................. B32B 31/00; C25D 5/02; C23F 1/02

[52] U.S. Cl. .................. 156/150; 29/846; 156/233; 156/249; 156/631; 156/634; 156/902; 174/68.5; 204/15; 427/96

[58] Field of Search ............... 156/150, 151, 233, 235, 156/241, 247, 249, 629, 631, 634, 656, 901, 902; 29/846, 848, 828; 204/15, 20, 23, 32 R, 38 E, 38 B; 430/313, 314, 315, 316, 318; 174/68.5, 98, 116; 427/96

[56] References Cited

U.S. PATENT DOCUMENTS 2,666,008  1/1954  Enslein et al. ................. 156/151 X
4,306,925 12/1981  Lebow et al. ...................... 156/150

Primary Examiner—William A. Powell
Attorney, Agent, or Firm—Lewis B. Sternfels; A. W. Karambelas; Victor G. Laslo

[57] ABSTRACT

A method for fabricating supported fine line electrical conductors comprises the steps of forming a pattern (16) which defines a configuration (18) of the desired conductors on a surface (12), placing electrically conductive material on the surface in a configuration defined by the pattern to form electrical conductors (20), removing only the pattern from the surface and thus leaving the configured electrical conductors thereon, adhering a support (22) to the electrical conductors with an adherence which is greater than that existing between the conductors and the surface, and separating the assembled conductors and support from the surface. One of the surface and of the support and assembled conductors is flexible and the other is relatively rigid, so that the flexible one can be peeled away from the rigid other.

16 Claims, 10 Drawing Figures

FINE LINE FLEXIBLE CABLE FABRICATION PROCESS

BACKGROUND OF THE INVENTION

The present invention relates to a method for fabricating fine line electrical conductors.

Fine line electrical conductors are fabricated both on flexible cables and rigid backings, and are widely used in and with a wide variety of electronic equipment for land, sea, air and space applications.

Fabrication of such flexible and rigid devices is generally effected by preparing a fine line circuit on a substrate material, such as of Kapton, and then providing a laminate therefrom to seal the conductor lines. To provide electromagnetic protection, a shield layer is then deposited on the laminated structure. Both the layered constructions are also made for high density interconnections. Modern electro-optical devices demand high packaging density, which may be met by using multilayers and/or by reducing the line width of the conductors. A typical line width is 4 mil or more, with future needs being toward finer lines.

The major problems in producing such fine line cables are associated with the preparation of the conductor lines. Conventionally, interconnecting circuit patterns are formed by a photlithographic process and by a chemical etching process, which involve many steps. Since the handling in any one particular step can create defects, therefore, as the steps are increased, the overall yield correspondingly decreases.

Conductors and fine line applications must have fine geometry and minimum voltage drop, which requires a high aspect ratio, that is, a ratio of the conductor's thickness to its width. In chemical processes, which are subtractive processes in that material is removed from a conductive layer to produce the fine line conductors, undercutting becomes a common problem. As the aspect ratio descreases, undercutting becomes an even greater problem and eventually cannot be tolerated. As a result, undercutting is a prime reason for rejecting articles.

Additional sources of rejected cables result from openings in or short circuiting between fine line conductors and poor adhesion of photoresist and metallization on the base substrate to which the fine line conductors are secured. Openings in the circuit increase expoenentially with a decrease in line width.

While both additive and subtractive processes require use of thin film stock, in the subtractive process special care must be used to prevent such defects as dents, scratches and creases which affect the production yield and product quality.

Access holes or vias are provided in the proporting dielectric film for access to solder, wire bonding and multilayer interconnects. When these holes are prefabricated in the film, the lack of mechanical support for the metal foil in these areas provides vulnerability to mechanical damage and to chemical attack during fabrication processing.

Such components as infrared detectors which are operated at cryogenic temperatures, require that one end of the interconnection cable for the detectors be at such a temperature, while the other end is at ambient temperature. This temperature differential or gradient creates a problem in heat loss by conduction. Thus, the thermal conductivity and electrical conductivity balance must be considered in the material selection.

SUMMARY OF THE INVENTION

The present invention overcomes and avoids the many problems associated with subtractive processes, by utilizing an additive process. Briefly, a pattern, which defines a configuration of the fine line conductors, is formed on a surface which, preferably, is polished stainless steel and which is used as a fabrication aid. Electrical conductive material is then placed on the surface in a configuration which is defined by the pattern configuration to form the electrical conductors. The pattern itself is removed from the surface, leaving the configured electrical conductors in place. A support dielectric material, such as a polyimide, preferably of Kapton (trademark of E. I. DuPont de Nemours & Company), is adhered to the thus formed electrical conductors, with an adherence which is greater than that existing between the conductors and the surface so that, in the next step, the assembled conductors and support may be easily separated from the surface. Thereafter, the conductors on the support may be further laminated into a finished product.

Several advantages accrue from such an additive process. Finer conductor lines are produceable because there is no undercutting involved in the inventive process. Fewer handling steps are involved, which enable higher yield and higher quality cables to be obtained. The fewer handling steps also enable the cost of the products to be reduced. Wider choices of line height are also obtainable.

Other aims and objects as well as a more complete understanding of the present invention will appear from the following explanation of exemplary embodiments and the accompanying drawings thereof.

BRIEF DESCRIPTION OF THE DRAWINGS

FIGS. 1-9 depicts the several steps in forming fine line cable, in which

DETAILED DESCRIPTION OF THE INVENTION

Figure 1:
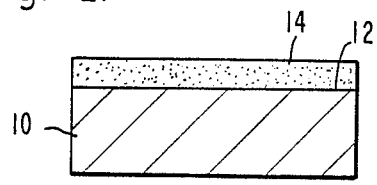

Accordingly, in a first embodiment of the present invention, as illustrated in FIG. 1, a fabrication aid disposed as a base 10 is provided with a surface 12 to which anything deposited thereon will only weakly adhere. The preferred base is a plain polished stainless steel plate having a high chromium-nickel composition. Accordingly, a 300 series stainless steel plate is prefered. In addition, electrodeposited and electrolessly deposited metals, acting as different surfaces 12 on base 10, are also acceptable. Such metals include copper, nickel and silver. Because such electro or electroless deposition requires later removal in the process, the plain polished stainless steel plate is preferred to minimize the number of steps required.

A resist film 14 is then placed on surface 12. Resist 14 comprises any suitable dry or liquid resist for photolithographic processing. The type of photoresist is selected according to the intended application. For etching, a 4-5 micron thick liquid resist is adequate to cover the rough surface of most substrates. However, for electroplating on a thin, liquid-resist pattern, resist thickness limits the ultimate conductor thickness. Conductor thickness of 7 microns is obtainable by using Shipley 1375, which is capable of providing a height of 10 microns. However, because liquid resists do not provide as well a defined perpendicular resist wall as may be required, a dry resist film, such as Riston (trademark of E.I. DuPont de Nemours & Company) for electroplating. Such a dry film resist is capable of providing a thickness in the 25-50 micron range with a well defined, perpendicular resist edge profile which is excellent for plating. In addition, a dry film resist also requires less exposure energy than liquid resists.

Figure 2A:
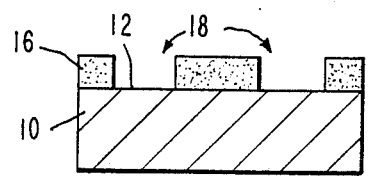
Figure 2B:
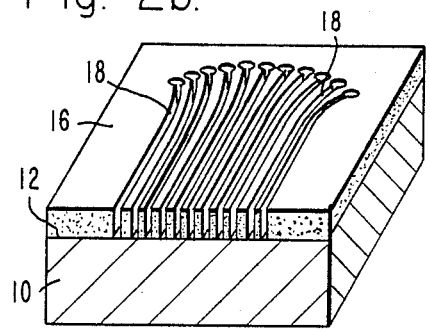
FIG. 2(b) is a perspective of FIG. 2a and FIG. 9 illustrates a cross-section of a finished product.

A circuit pattern of the desired fine line electrical conductor configuration is placed atop resist 14 and exposed to light energy, followed by removal of the resist, all utilizing conventional techniques, to provide a pattern 16 as illustrated in FIGS. 2a and 2b. Pattern 16 is provided with openings 18 extending to surface 12 which are configured according to the desired circuit pattern.

Figure 3:
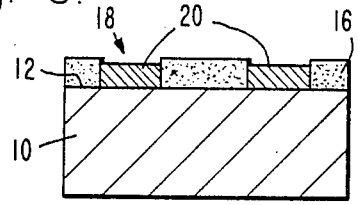
Figure 4:
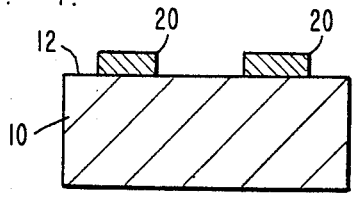

The circuit pattern is electroplated through openings 18 as shown in FIG. 3, leaving electroplated deposits of conductors 20 on surface 12. Resist pattern is then removed leaving plurality of conductors 20 weakly secured to surface 12 as shown in FIG. 4.

Figure 5:
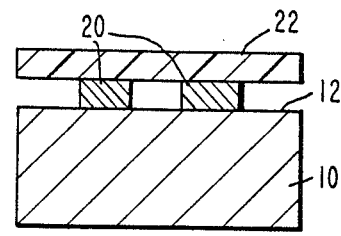
Figure 6:
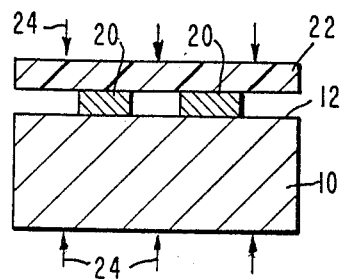
Figure 7:
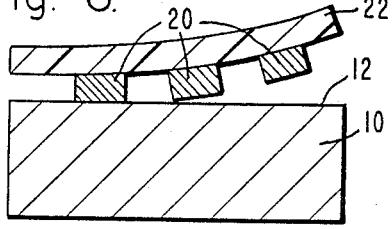

A sheet of supporting dielectric material 22, such as of Kapton, with an adhesive layer thereon, such as of an acrylic polymer, e.g., Pyrolux (trademark of E. I. DuPont de Nemours & Company), which is a methyl methacrylate crosslinked with phenol, is laminated onto the electroplated pattern comprising conductors 20 as depicted in FIG. 5. As illustrated in FIG. 6, lamination occurs under heat and pressure, with arrows 24 denoting pressure at a preferred temperature of 250° F. (121° C.) at a pressure of 100-250 psi (70-176 kg./sq. cm.) for about 10 minutes. The dielectric substrate with conductors 20 secured thereto is then peeled from surface 12 on base 10 because the adherence between the conductors and their substrate 22 is much greater than the adherence between the conductors and surface 12, as shown in FIG. 7.

Figure 8:
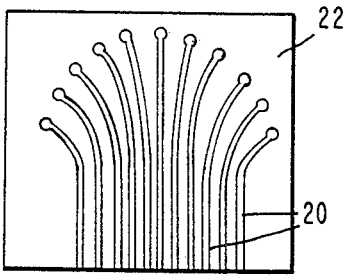

If electroless coppper or nickel were deposited on base 10, it would then be removed by a quick etching process. In either case, the product would then have an appearance such as shown in FIG. 8.

Figure 9:
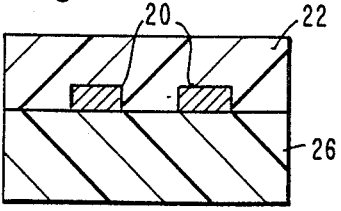

Further lamination of a protective dielectric cover 26 is applied as shown in FIG. 9 to protect the pattern comprising conductors 20 from the environment.

For construction of rigidly backed circuit patterns, fabrication acid comprising the stainless steel plate depicted in FIGS. 1-7 was replaced by a dielectric film such as of Kapton, so that the base is flexible, which then will be peeled fro the nonflexible circuit pattern support. The Kapton base was first cleaned with a detergent and dried and placed in a plater in a deposition system, which was then evacuated. The film was plasma-cleaned in situ and ion plated with a thin adhesion layer, e.g., 100-200 angstroms of titanium or nickel-chromium, and a conductor base of approximately 5000 angstroms of copper or nickel was placed on top of the thin adhesion layer.

The metalized film was then taped on a rigid backed board, cleaned, and coated with a liquid or solid film photoresist. The photoresist was exposed, developed, and electroplated with a conductor, such as of nickel or copper, to a desired thickness, e.g., 8-20 microns. The photoresist were then stripped with a resist stripper.

The unwanted conductor base was then removed by a short etchback to isolate the circuit pattern. The pattern was protected by laminating it with film, preferably of Kapton and Pyrolux.

Although the invention has been described with reference to particular embodiments thereof, it should be made therein without departing from the spirit or scope of the invention.

What is claimed is:

1. A method for fabricating fine line electrical conductors on a support comprising the steps of:
   utilizing a surface as a fabrication aid;
   selecting one of the surface and the support from a rigid material and the other from a material which is relatively flexible with respect to the rigid material;
   forming a pattern, which defines a configuration of the conductors, on the surface;
   placing electrically conductive material on the surface in a configuration defined by the pattern configuration to form the electrical conductors;
   removing only the pattern from the surface and thus leaving the configured electrical conductors thereon;
   adhering the support to the electrical conductors with an adherence greater than that which is between the conductors and the surface; and
   separating the asembled conductors and support from the surface by peeling the flexible one of the surface and of the assembled conductors and support from the other thereof.

2. A method according to claim 1 in which the surface is electrically conductive and said electrically conductive material placing step comprises the step of electroplating the conductive material onto the electrically conductive surface.

3. A method according to claim 2 further comprising the steps of forming the surface by utlizing a stainless steel plate.

4. A method according to claim 3 in which the stainless steel plate comprises a polished 300 series stainless steel.

5. A method according to claim 3 in which the surface on the stainless steel comprises copper, nickel or silver.

6. A method according to claim 2 in which said adhering step comprises the step of applying heat and pressure to a laminate of an adhesive layer interposed between the support and the electroplated conductive material as configured as the electrical conductors.

7. A method according to claim 6 in which said heat applying step is at about 250° F.

8. A method according to claim 7 in which said pressure applying step is typically from 100 psi to 250 psi.

9. A method according to claim 8 in which the dielectric material comprises a polyimide and the adhesive layer comprises a methyl methacrylate crosslinked with phenol.

10. A method according to claim 1 in which said adhering step comprises the step of applying heat and pressure to a laminate of an adhesive interposed between the support and the electrical conductors.

11. A method according to claim 10 in which said heat applying step is at about 250° F.

12. A method according to claim 11 in which said pressure applying step is typically from 100 psi to 250 psi.

13. A method according to claim 1 further comprising the step of forming the surface by placing a conductive film on a base of dielectric material.

14. A method according to claim 13 in which the dielectric material is pliable, and further comprising the step of adhering the pliable dielectric material to a rigid backing.

15. A method according to claim 14 in which said conductive film placing step comprises the steps of electrolessly depositing a thin conductive layer on the dielectric material and a conductor base on the conductive layer.

16. A method according to claim 15 further comprising the step of etching the conductor base from the electrically conductive material following said electrically conductive material placing step and said pattern removing step to electrically isolate the configured electrical conductors on the dielectric material.

* * * * *